United States Patent [19]
Barringer

[11] Patent Number: 6,062,894
[45] Date of Patent: May 16, 2000

[54] SYSTEM AND METHOD FOR INSERTING CIRCUIT BOARDS IN TIGHT SPACES

[75] Inventor: Dennis R. Barringer, Wallkill, N.Y.

[73] Assignee: International Business Machines Corporation, Armonk, N.Y.

[21] Appl. No.: 09/183,546

[22] Filed: Oct. 30, 1998

[51] Int. Cl.[7] .................................................. H01R 13/64
[52] U.S. Cl. .......................................................... 439/377
[58] Field of Search ................................ 439/476.1, 483, 439/376, 259, 347, 342, 377; 211/41.17; 361/756, 741, 802

[56] References Cited

U.S. PATENT DOCUMENTS

| | | | |
|---|---|---|---|
| 3,641,395 | 2/1972 | Nation | 317/117 |
| 5,317,481 | 5/1994 | Hillil et al. | 361/796 |
| 5,432,682 | 7/1995 | Giehl et al. | 361/796 |
| 5,657,204 | 8/1997 | Hunt | 361/752 |
| 5,751,559 | 5/1998 | Jensen et al. | 361/802 |
| 5,815,377 | 9/1998 | Lund et al. | 361/802 |
| 5,848,906 | 12/1998 | Glusker et al. | 439/157 |

*Primary Examiner*—Neil Abrams
*Assistant Examiner*—Brian S. Webb
*Attorney, Agent, or Firm*—Floyd A. Gonzalez; Cantor Colburn LLP

[57] ABSTRACT

An adjustable size hot plug assembly includes a frame, an actuator and at least one arm connected thereto. The arm includes an adjustable clip and a fixed clip to retain a printed circuit board. Where more than one arm is employed (preferably three are employed in the invention), the middle arm and one end arm are adjustable toward or away from one another and toward or away from the other end arm which may be fixed. The invention allows the hot plug assembly to be universal in that it can be adapted to fit any Peripheral Component Interconnect (PCI) card.

15 Claims, 7 Drawing Sheets

SYSTEM AND METHOD FOR INSERTING CIRCUIT BOARDS IN TIGHT SPACES

BACKGROUND OF THE INVENTION

1. Field of the Invention

The invention relates to printed circuit board installation in electronic devices. More particularly, the invention relates to an adjustable carrier for Peripheral Component Interconnect (PCI) cards that allows any card to be engaged by the carrier to be "hot plugged" into an electronic device.

2. Prior Art

Electronic equipment technicians, and indeed some private individuals as well, are aware that printed circuit boards (PCB) are employed within many pieces of electronic equipment. It is also known by these individuals that these "cards" can in some cases be removed for repair of a device or an upgrade thereof or simply to alter the operating parameters thereof Most notable are computer devices where different functions or memory capacity can be needed.

Conventionally, the changing of a card is done by removing the cover of the machine and manually removing the existing card and plugging in a new one. This procedure may be complicated further in systems where entire banks of cards must be removed above the one being replaced or the bank of cards where one is to be replaced must removed. In such instances the machine must be shut down. Since both the shut down and start up procedure can be time consuming, shut down is undesirable.

More recently, some electronic equipment has been designed to accept a card carrier comprising a frame with means to insert the card into an electrical receptacle while the cover is still in place on the device. This type of an operation is known as "hot plugging". While the existing hot plugging PCI card carriers are effective and beneficial for their intended purpose, they are card specific. Unfortunately, then, one needs a specific carrier for every type of card he wishes to use.

Examples of such carriers are described in detail in U.S. Ser. No. 08/766,566, filed Dec. 13, 1996 and U.S. Pat. No. 5,868,585, all assigned to the assignee hereof and both fully incorporated herein by reference.

The art is in need of an adjustable carrier which is capable of accepting and supporting many different types of PCI cards for hot plugging operations.

SUMMARY OF THE INVENTION

The invention expands upon the utility of the carrier disclosed in the above-referenced applications by enabling adjustability in two directions to enable the carrier to accept any type of PCI card.

The invention comprises an actuator and a main frame having at least one and preferably two or three arms depending therefrom which arms are connected to said actuator. The arms are moveable laterally and are reliably retainable in the desired position. This allows for lengthwise adjustment of the carrier. The carrier is also height adjustable through clips which are mounted on the arms in such a way as to be moveable either toward or away from a foot of the arms where a card receiving channel is located. Each clip also contains a card receiving channel. By positioning the clip on each arm appropriately to pinch the card against the foot, the card is reliably held.

This invention further comprises a dual movement size adjustable printed circuit board carrier having a main frame, an actuator attached to the main frame, at least one arm attached to the actuator and adjustable thereon, a foot on at least one arm and a clip on at least one arm, adjustable along the arm to adjust spacing between the clip and the foot. The clip can further define three clips. The foot includes a groove to receive a printed circuit board edge.

The actuator includes angular slots with respect to the length of the actuator. The slots communicate with pins in the main frame and cause lateral movement of the actuator with respect to the main fame when the actuator is moved in the slots. The actuator is laterally moveable relative to the main frame upon actuation of the actuator. The actuator also has unidirectional teeth.

At least one arm further defines two arms adjustably attachable to said actuator and a third arm fixedly attached to said actuator. At least one arm is a side grasp arm having a holder arm and a support arm attached together. The side grasp arm is mounted to the actuator with two dove tail complement features thereon. The dove tail complement features being receivable in a dove tail channel in said actuator. The support arm provides rigidity to the holder arm. The holder arm has a side facing printed circuit board gripper with a side facing groove therein adapted to receive a printed circuit board edge.

Each arm includes teeth on one surface. At least one arm is attached to the actuator with at least a pawl that is intermeshable with the teeth. The pawl is a set of teeth similar to the actuator teeth and are intermeshable therewith. Each clip also has teeth that are intermeshable with the teeth on the arms.

In another embodiment of the invention, a side holding arm to hold cards whose structure does not allow holding on the bottom is disclosed.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figures 1, 2A:
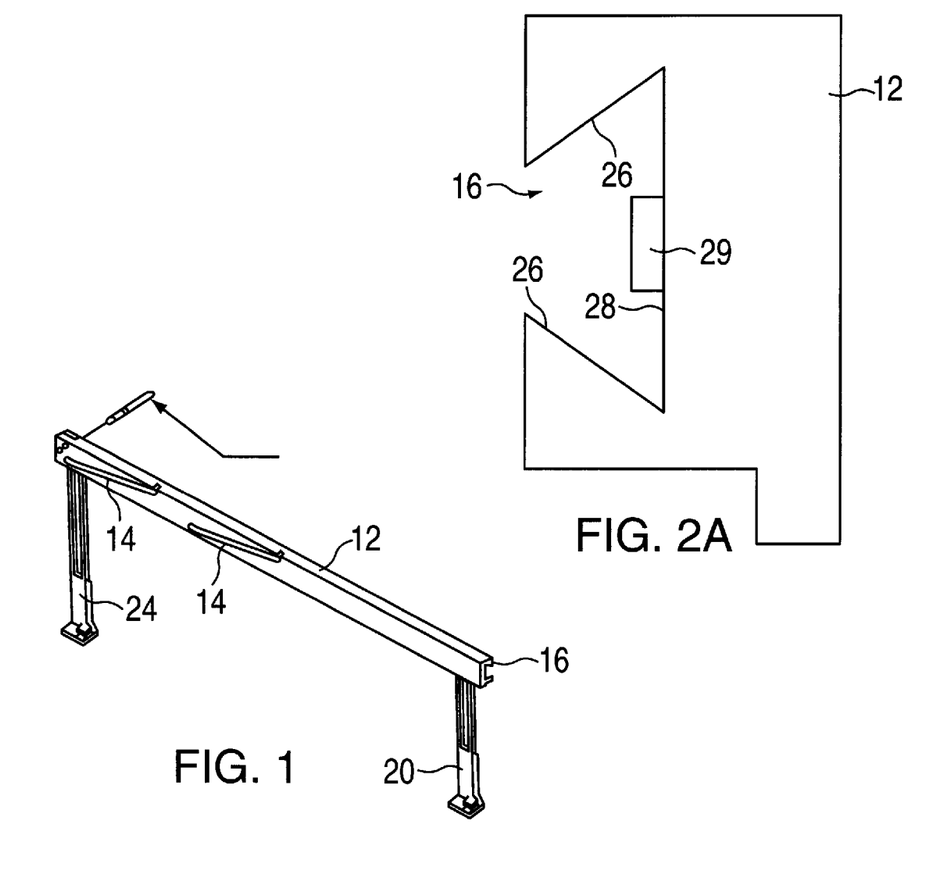
FIG. 1 is a perspective view of the invention from a first side thereof.
FIG. 2A is an enlarged cross section of FIG. 2 taken along section line 2A—2A.
Figure 2:
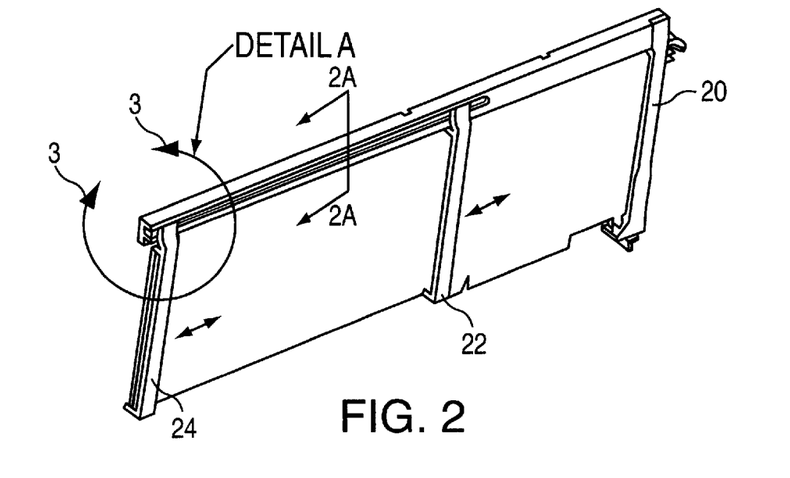
FIG. 2 is a perspective view of the invention from a second side thereof.

In FIGS. 1 and 2, first and second sides of the carrier of the invention are shown. For purposes of clarity of the invention, the actuator in which the components of the invention mount, is not shown. Such actuator is however shown and fully described in the previously incorporated by reference U.S. application Ser. Nos. 08/766,566 and 08/764,963.

Referring with more detail to FIGS. 1 and 2 the main frame 12 is shown with angular actuation slots 14. The slots are actuated by pins in the actuator of the carrier which is described as stated above. At the right edge of the drawing in FIG. 1, the dove tail 16 profile is visible. In FIG. 2, it is apparent that tail end arm 20 is fixed to main frame 12 (this is also apparent from FIG. 1) whereas middle arm 22 and far end arm 24 are adjustable in distance from tail end arm 20. The adjustability is occasioned by connection of each of middle arm 22 and far end arm 24 in dove tail 16 of actuator 12. An enlarged cross section of actuator 12 is illustrated in FIG. 2A to illustrate the dove tail. As will be appreciated from the figure, the dove tail profile comprises preferably a truncated triangular form having angle walls 26 and base wall 28. Base wall 28 further includes a row of teeth 29 projecting therefrom. The teeth are a directional tooth pattern having preferably about a 30° angled tooth face from a root horizontal reference and about 92° upright surface angle from the same root horizontal reference. The teeth are directionally oriented toward tail end arm 20 in a preferred embodiment.

Figure 3:
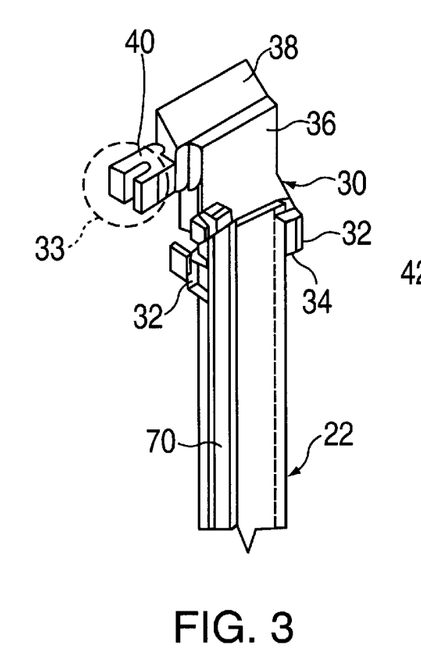
FIG. 3 is an enlarged perspective view of circumscribed area 3—3 of FIG. 2.
Figure 3A:
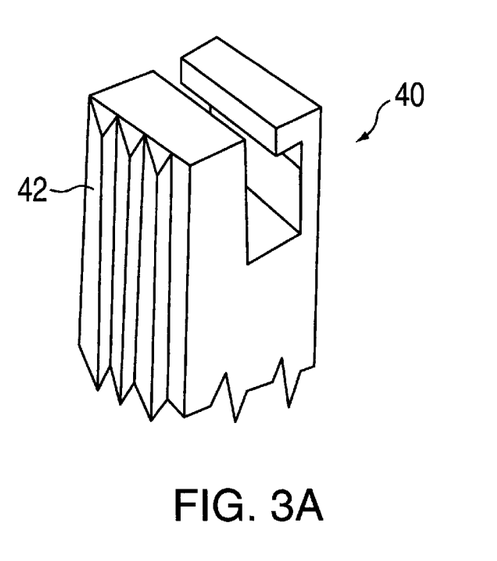
FIG. 3A is an enlarged perspective view of circumscribed area 3—3 in FIG. 3.
Figure 4:
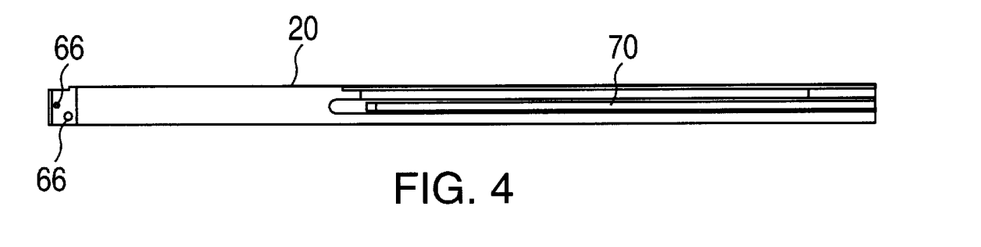
FIG. 4 is a side view of the tail end arm of the invention shown through the dove tail opening and illustrating teeth.

Referring to FIGS. 3 and 3A, the complementary structure to dove tail 16 is illustrated extending from one end of an arm (which may be either arm 22 or 24; both are endowed with such structure). The structural feature may be molded onto its attached arm or may be constructed in clip form and then fastened to an arm in a multiplicity of fastening arrangements. In FIG. 3, the arrangement illustrated is a clip. The clip 30 includes detents 32 on either edge of the arm to snap-lock thereto. The detents 32 are of the type having a lip 34 section to hold them onto a separate structure, in this case the arm. The clip 30 extends upwardly from detents 32 in an offset portion 36. Offset portion 36 is attached to or integrally formed with dove tail complement 38 which has an outer shape receivable in the dove tail 16 of main frame 12.

Extending sidewardly from dove tail complement 38 is bifurcated tab 40. The bifurcated tab 40 is preferably bifurcated to allow insertion of a device to bend the tab away from engagement with actuator teeth 29, but it could be a straight tab without the bifurcation. On the side of the tab 40 are a plurality of teeth 42 meshable with teeth 29 of main frame 12. The teeth 42 of tab 40 are oriented to be moveable in one direction, preferably toward tail end arm 20, but not moveable in the other direction when the sets of teeth (29, 42) are engaged i.e. teeth 42 are a mirror image of teeth 29. Clip 30 thus slidably attaches middle arm 22 and far end arm 24 to main frame 12 and the tabs for each clip allow adjustability of the arms to desired distances from tail end arm 20.

Figure 5:
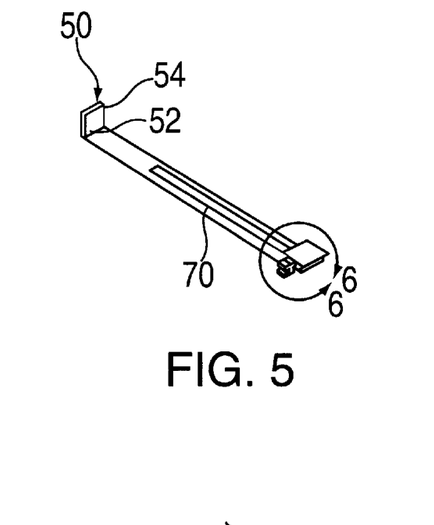
FIG. 5 is a perspective view of a far end and middle arm of the invention.
Figure 6:
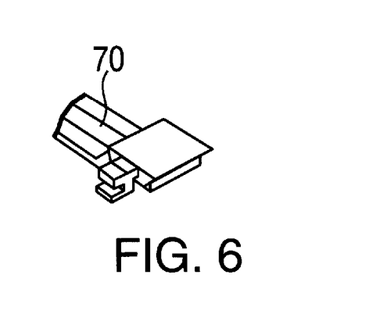
FIG. 6 is an enlarged perspective view of circumscribed area 6—6 of FIG. 5.
Figure 7:
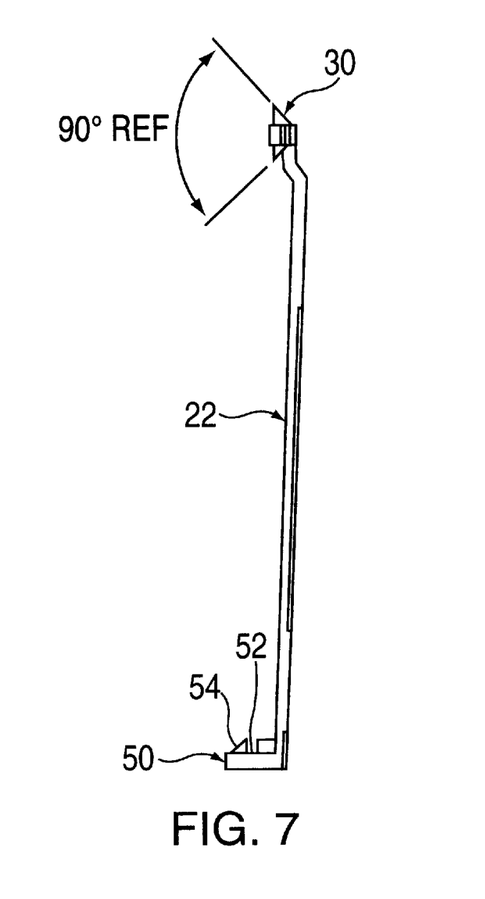
FIG. 7 is an edge view of the arm of FIG. 5.

Each of the middle and far end arms includes a foot having a profile adapted to receive an edge of a PCI card. Referring to FIGS. 5 and 7, foot 50 is illustrated in perspective and end view, respectively. Foot 50 comprises a groove 52 and lip 54. The groove receives the edge of a card to be supported and provides such support. At the top of the arms is clip 30.

Figure 8:
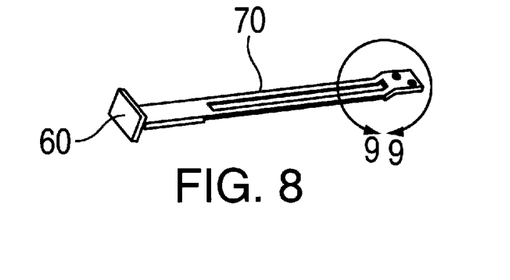
FIG. 8 is a perspective view of a tail end arm of the invention.
Figure 10A:
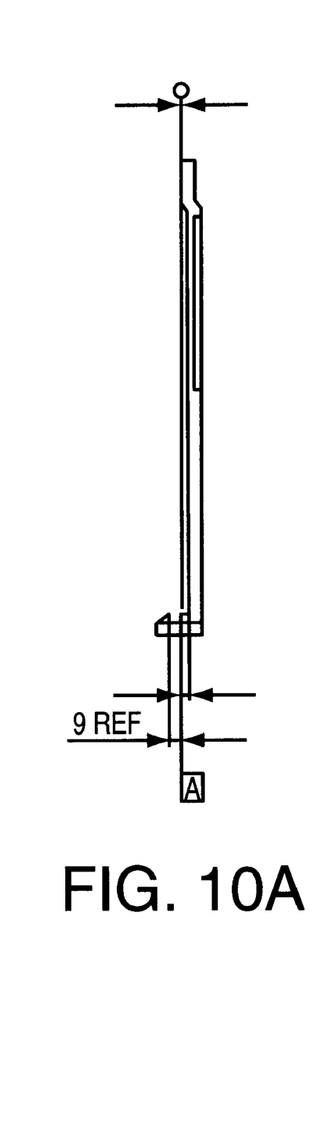
FIG. 10A is an edge view of the arm of FIG. 8.
Figure 10B:
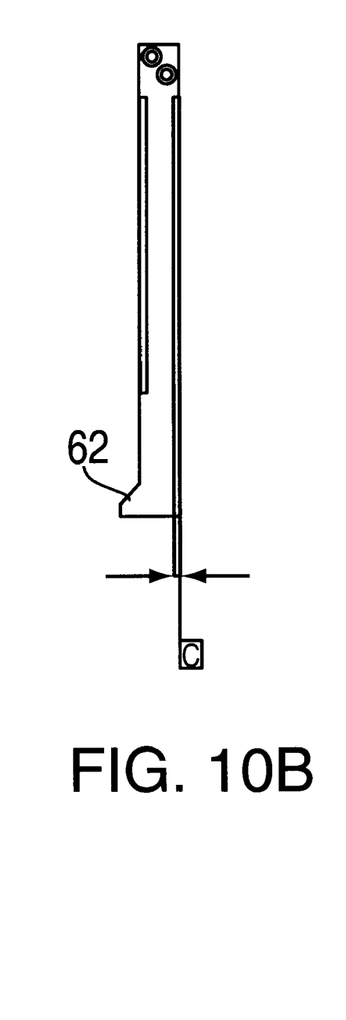
FIG. 10B is a side view of the arm of FIG. 8.

Referring to FIGS. 8, 10A and 10B one of skill in the art will appreciate that the foot 60 for tail end arm 20 is slightly different from the feet 50 of middle arm 22 and far end arm 24. More specifically, foot 60 is provided gusset structure 62 for additional strength.

Figure 9:
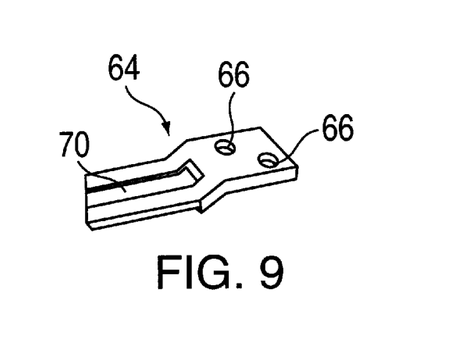
FIG. 9 is an enlarged perspective view of circumscribed area 9—9 in FIG. 8.

Referring to FIG. 9, one will note that the upper end of arm 20 is distinct from arms 22 and 24. More specifically, the upper end 64 of arm 20 is adapted to be permanently and non-adjustably affixed to main frame 12 with rivets or other suitable fasteners through holes 66 which preferably are arranged in an angular pattern to increase strength. This is preferred arrangement for the invention since it is not necessary to move tail end arm 20. It is possible however to provide an arrangement similar to that described with respect to arms 22 and 24 for arm 20 if desired.

Common among all of the arms 22, 24, 20 of the invention are teeth 70 which extend along one surface of each arm as shown in FIGS. 5–10. The teeth are preferably of the same parameters as the main frame teeth 29 and angle preferably toward the appropriate foot structure (50 or 60). Teeth 70 intermesh with adjustment clips 80, 110 and 120 to adjust the distance between each clip and its respective foot so that different height cards are graspable. The clips are illustrated in FIGS. 11–18.

Figure 11:
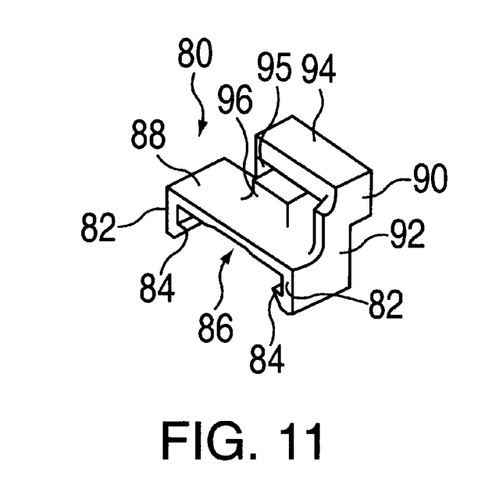
FIG. 11 is a front perspective view of a far end clip of the invention.
Figure 12:
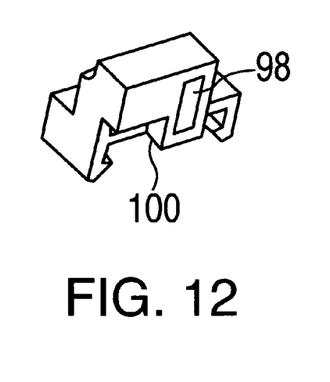
FIG. 12 is a back perspective view of a far end clip of the invention.

Referring first to FIGS. 11 and 12, the far end clip 80 includes two detent structures 82 having lips 84 which define an opening 86 of a size appropriate to accept far arm 24. Clip body 88 supports the foregoing features. Depending from clip body 88 is card receiver 90 which is generally L-shaped comprising a card stop 92 and groove plate 94 and groove 95. Opposed from groove plate 94 and depending from body 88 is card locator 96. Visible only in FIG. 12 is adjuster 98 and teeth 100. Adjuster 98 depends from card receiver 90 and extends toward opening 86 penetrating the boundary of the opening to a small degree. By penetrating the opening 86, teeth 100 come into engagement with teeth 70 on far end arm 24 when the clip is installed on an arm. Teeth 100 are also identical to the description of teeth 29. Clip 80 can be slid in the direction of foot 50 to trap a card therebetween.

Figure 13:
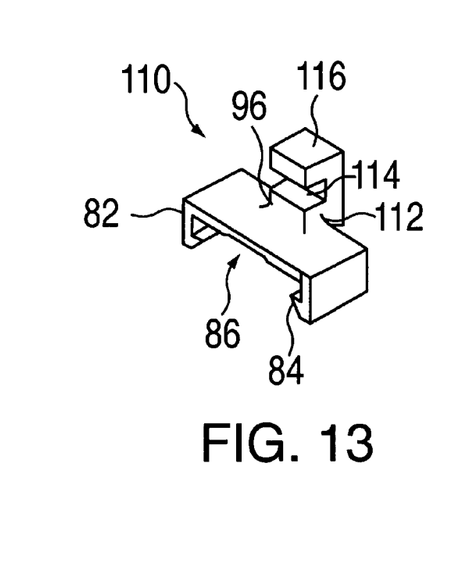
FIG. 13 is a front perspective view of a middle clip of the invention.
Figure 14:
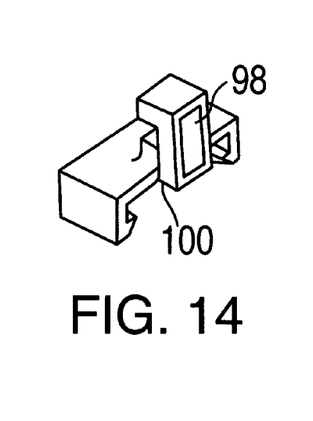
FIG. 14 is a back perspective view of a middle clip of the invention.

Referring to FIGS. 13 and 14, middle clip 110 is illustrated. Middle clip 110 is similar to far end clip 80 with respect to detents 82, lips 84, body 88 and opening 86 but differs in the card receiver. The card receiver 112 in middle clip 110 depends from card locator 96 and provides a groove 114 and edge 116 to trap a PCI card edge therein. Depending also from card receiver 112 is adjuster 98 which includes teeth 100 and is essentially identical to that of far end clip 80. The teeth function identically to clip 80.

Figure 15:
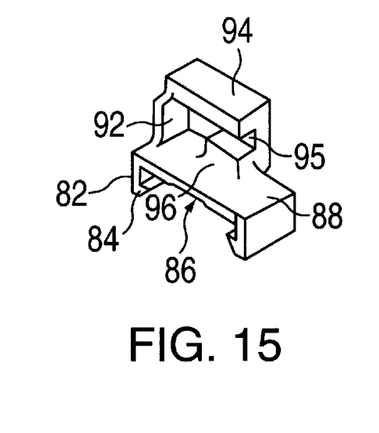
FIG. 15 is a front perspective view of a tail end clip of the invention.
Figure 16:
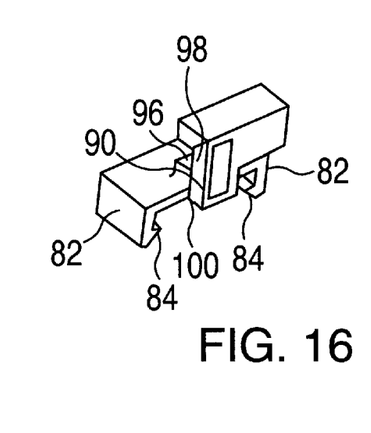
FIG. 16 is a back perspective view of a tail end clip of the invention.

Referring to FIGS. 15 and 16 one of skill in the art will appreciate that tail end clip 120 is a mirror image of far end clip 80. For this reason all description and numerals are identical.

Figure 17:
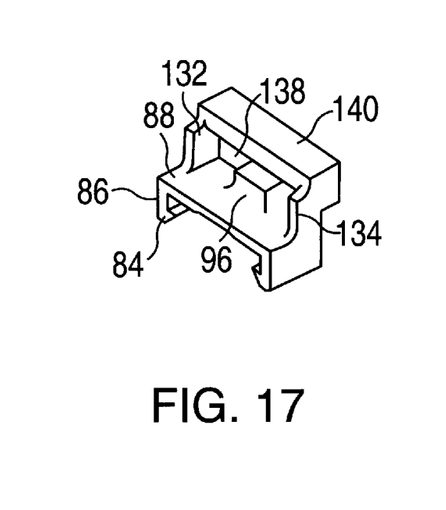
FIG. 17 is a front perspective view of a common clip of the invention.
Figure 18:
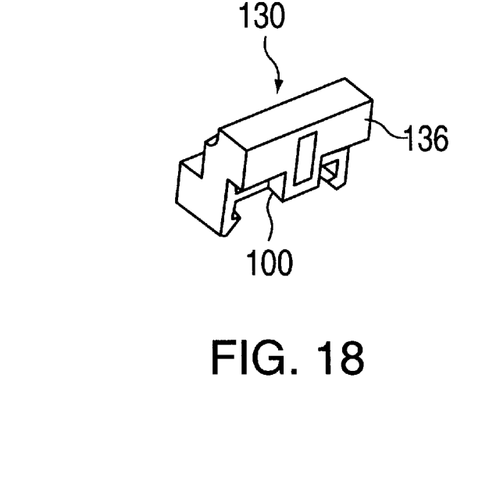
FIG. 18 is a back perspective view of a common clip of the invention.
Figure 19:
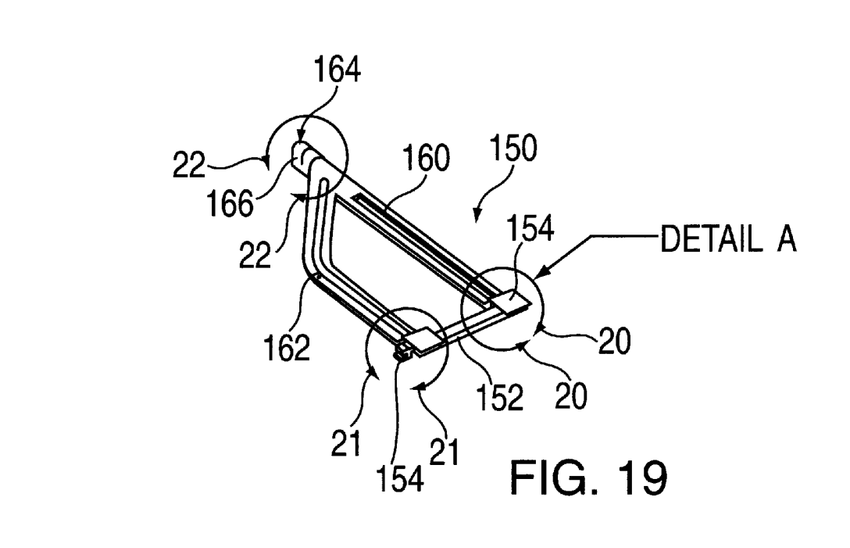
FIG. 19 is a perspective view of an alternate arm structure.
Figure 20:
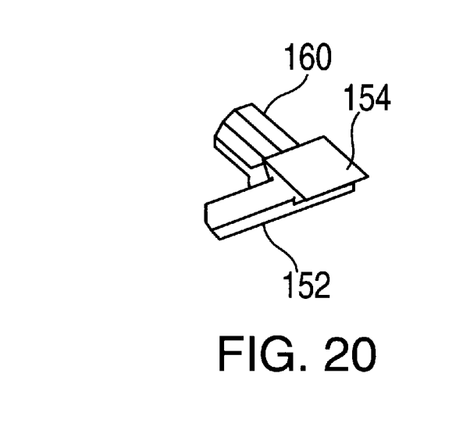
FIG. 20 is an enlarged perspective view of circumscribed area 20—20 in FIG. 19.
Figure 21:
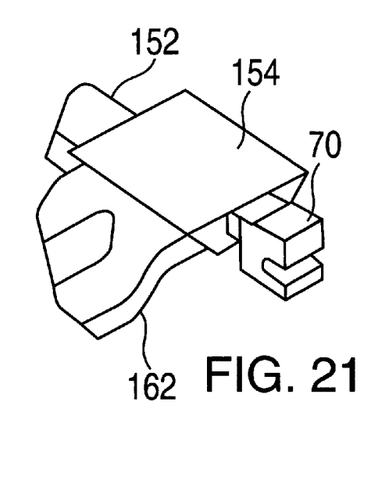
FIG. 21 is an enlarged perspective view of circumscribed area 21—21 in FIG. 19.
Figure 22:
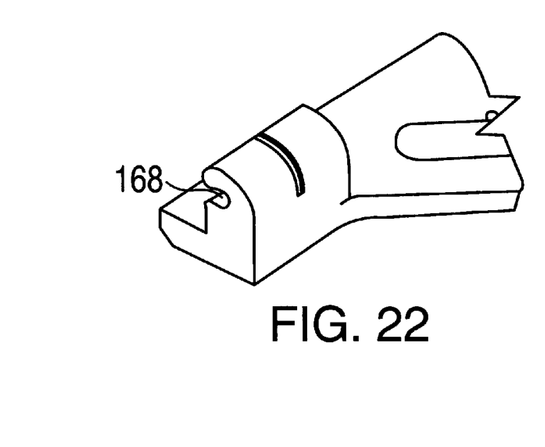
FIG. 22 is an enlarged perspective view of circumscribed area 22—22 in FIG. 19.

Referring to FIGS. 17 and 18, an alternate clip is illustrated which is employable in place of any of the above noted clips. The clip 130 is a "common clip" i.e. can be substituted on any arm of the invention with minor modification. One will note that clip includes walls 132 and 134. One or both of these walls are removable to render the clip capable of substituting for clip 80, 110 or 120. Other features of the clip are similar such as detents 82 with lips 84, body 88, locator 96 and teeth 100. The difference in this clip is merely the card receiver 136 itself since it spans the total length of the clip and provides a longer groove 138 and groove plate 140. Teeth 100 act identically to the foregoing.

In an alternate arm embodiment of the invention, for cards that do not permit grasping at the plug-in edge, the arm grasps the side edge of the PCI card. Referring to FIGS. 19–22, the side hold arm 150 employs a dove tail bar 152 including two dove tail complements 154 which are receivable in main frame 12. Each of the dove tail complements work as do the single dove tail complements. Depending from dove tail bar 152 and preferably directly under each dove tail complement 154 is an arm. The arms constitute card holder arm 160 and support arm 162 which provides additional stability and rigidity to holder arm 160. Arm 160 also is supplied with teeth 70 as are the other arm embodiments of the invention and which are used identically thereto. At the lower end of arm 160 is side clip 164 which comprises card receiver 166 and groove 168. The groove 168 is sized to grasp a PCI card along the side edge thereof to hold the card into the carrier of the invention.

In operation the invention is adjustable to any size PCI card and functions to install such cards in a hot plug connection as described in the aforeincorporated patent applications.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A printed circuit board manipulator comprising:
   an actuator;
   a main frame mounted in said actuator;
   at least one arm adjustably mounted to said main frame;
   at least one clip adjustably mounted to said arm, wherein at least one additional clip is fixedly secured to said arm; and
   said arm having a plurality of teeth for selectively adjusting to a size of any printed circuit board.

2. In a printed circuit board manipulator having a main frame, actuator and at least one arm depending from said main frame, said at least one arm having a foot adapted to receive and support an edge of a printed circuit board wherein the improvement comprises:
   said main frame and said at least one arm being separate structures, said main frame including a plurality of teeth;
   a clip mountable to said arm and engageable with said main frame, said clip leaving a plurality of teeth engageable with said plurality of teeth on said main frame, said clip being selectively moveable to selected positions on said plurality of teeth of said main frame to adjust said manipulator to a size adapted to any printed circuit board.

3. In the printed circuit board manipulator as claimed in claim 2 wherein said at least one arm is two arms moveably attached to said main frame and one arm immovably attached to said main frame.

4. In a printed circuit board manipulator having a main frame, an actuator and at least one arm depending from said main frame, said at least one arm having a foot adapted to receive and support an edge of a printed circuit board wherein the improvement comprises:
   said at least one arm being selectively positionable along said main frame and said foot being selectively positionable along said at least one arm to adjust the size of the manipulator.

5. In the printed circuit board manipulator as claimed in claim 4 wherein said main frame includes a dove tail channel longitudinally therein and said at least one arm attaches to said main frame through a dove tail complement attached to said at least one arm.

6. A dual movement size adjustable printed circuit board carrier comprising:
   an actuator;
   a main frame attached to said actuator, said main frame being laterally moveable relative to said actuator upon actuation of said main frame;
   at least one arm attached to said main frame and adjustable thereon;
   a foot on said at least one arm, said foot including a groove to receive a printed circuit board edge;
   a clip on said at least one arm, adjustable along said arm to adjust spacing between said clip and said foot.

7. A dual movement size adjustable printed circuit board carrier as claimed in claim 6 wherein said main frame includes angular slots with respect to a length of said main frame, said slots communicating with pins in said actuator and causing lateral movement of said main frame with respect to said actuator when moved in said slots.

8. A dual movement size adjustable printed circuit board carrier as claimed in claim 6 wherein said at least one arm is two arms adjustably attachable to said main frame and a third arm fixedly attached to said main frame.

9. A dual movement size adjustable printed circuit board carrier as claimed in claim 6 wherein said main frame further includes unidirectional teeth and said at least one arm is attached to said main frame with at least a pawl intermeshable with said teeth.

10. A dual movement size adjustable printed circuit board carrier as claimed in claim 9 wherein said pawl is a set of teeth similar to said main frame teeth and intermeshable therewith.

11. A dual movement size adjustable printed circuit board carrier as claimed in claim 8 wherein each of said arms includes teeth on one surface thereof and said clip is three clips each having teeth, intermeshable with said teeth on said arms.

12. A dual movement size adjustable printed circuit board carrier as claimed in claim 6 wherein said at least one arm is a side grasp arm having a holder arm and a support arm attached together, said support arm providing rigidity to said holder arm and said holder arm having a side facing printed circuit board gripper with a side facing groove therein adapted to receive a printed circuit board edge.

13. A dual movement size adjustable printed circuit board carrier as claimed in claim 12 wherein said side grasp arm is mounted to said main frame with two dove tail complement features thereon, said dove tail complement features being receivable in a dove tail channel in said main frame.

14. A printed circuit board manipulator as claimed in claim 1 wherein said at least one arm depends from said actuator, said at least one arm having a foot adapted to receive and support an edge of a printed circuit board wherein the improvement further comprises:

said actuator and said at least one arm being separate structures, said actuator including a plurality of teeth;

a clip mountable to said arm and engageable with said actuator, said clip having a plurality of teeth engageable with said plurality of teeth on said actuator, said clip being selectively moveable to selected positions on said plurality of teeth of said actuator to adjust said manipulator to a size adapted to any printed circuit board.

15. A printed circuit board manipulator recited in claim 1, wherein said main frame includes a plurality of teeth for selectively adjusting to a size of any printed circuit board.

* * * * *

UNITED STATES PATENT AND TRADEMARK OFFICE
CERTIFICATE OF CORRECTION

PATENT NO. : 6,062,894
DATED : May 16, 2000
INVENTOR(S) : Dennis R. Barringer

Page 1 of 1

It is certified that error appears in the above-identified patent and that said Letters Patent is hereby corrected as shown below:

Column 1,
Line 19, insert period -- . -- between "thereof" and "Most"

Column 3,
Line 42, delete "actuator" and insert therefor -- main frame --
Line 43, delete "actuator" and insert therefor -- main frame --

Column 4,
Line 4, delete "actuator" and insert therefor -- main frame --

Signed and Sealed this

Thirtieth Day of April, 2002

Attest:

Attesting Officer

JAMES E. ROGAN
Director of the United States Patent and Trademark Office